(12) United States Patent
Loboda et al.

(10) Patent No.: US 8,860,040 B2
(45) Date of Patent: Oct. 14, 2014

(54) HIGH VOLTAGE POWER SEMICONDUCTOR DEVICES ON SIC

(71) Applicant: Dow Corning Corporation, Midland, MI (US)

(72) Inventors: Mark Loboda, Bay City, MI (US); Gilyong Chung, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 13/959,855

(22) Filed: Aug. 6, 2013

(65) Prior Publication Data

US 2014/0070234 A1    Mar. 13, 2014

Related U.S. Application Data

(60) Provisional application No. 61/699,797, filed on Sep. 11, 2012.

(51) Int. Cl.
| | |
|---|---|
| *H01L 29/15* | (2006.01) |
| *H01L 31/0312* | (2006.01) |
| *H01L 21/02* | (2006.01) |
| *H01L 29/16* | (2006.01) |

(52) U.S. Cl.
CPC ...... *H01L 29/1608* (2013.01); *H01L 21/02378* (2013.01); *H01L 21/02447* (2013.01); *H01L 21/02433* (2013.01); *H01L 21/02529* (2013.01)
USPC ............................................ 257/77; 117/951

(58) Field of Classification Search
USPC .............................. 257/77, E31.023; 117/951
See application file for complete search history.

(56) References Cited

U.S. PATENT DOCUMENTS

| | | |
|---|---|---|
| 2,854,364 A | 9/1958 | Lely |
| 3,691,694 A | 9/1972 | Goetz et al. |

(Continued)

FOREIGN PATENT DOCUMENTS

| | | |
|---|---|---|
| CN | 101724344 | 6/2010 |
| CN | 102107391 | 6/2011 |

(Continued)

OTHER PUBLICATIONS

Chen, Y., et al. "Studies of the Distribution of Elementary Threading Screw Dislocations in 4H Silicon Carbide Wafer." Materials Science Forum 600-603 (2007): 301-304.

(Continued)

*Primary Examiner* — Nicholas Tobergte
(74) *Attorney, Agent, or Firm* — Nixon Peabody LLP

(57) ABSTRACT

4H SiC epiwafers with thickness of 50-100 μm are grown on 4° off-axis substrates. Surface morphological defect density in the range of 2-6 $cm^{-2}$ is obtained from inspection of the epiwafers. Consistent carrier lifetime in the range of 2-3 μs has been obtained on these epiwafers. Very low BPD density has been confirmed in the epiwafers with BPD density down to below 10 $cm^{-2}$. Epitaxial wafers with thickness of 50-100 μm have been used to fabricate diodes. High voltage testing has demonstrated blocking voltages near the theoretical values for 4H-SiC. Blocking voltage as high as 8 kV has been achieved in devices fabricated on 50 μm thick epitaxial films, and blocking voltage as high as 10 kV has been obtained in devices fabricated on 80 μm thick films. Failure analysis confirmed triangle defects, which form from surface damage or particles present during epitaxy, are killer defects and cause the device to fail in reverse bias operation. In addition, the leakage current at the high blocking voltages of the JBS diodes showed no correlation with the screw dislocation density. It is also observed that the main source of basal plane dislocations in the epilayer originates in the crystal growth process.

10 Claims, 3 Drawing Sheets

(56) References Cited

U.S. PATENT DOCUMENTS

| | | | |
|---|---|---|---|
| 4,582,561 A | 4/1986 | Loku et al. | |
| 4,855,254 A * | 8/1989 | Eshita et al. | 117/94 |
| 4,866,005 A | 9/1989 | Davis et al. | |
| 4,912,063 A | 3/1990 | Davis et al. | |
| 4,912,064 A | 3/1990 | Kong et al. | |
| 5,679,153 A | 10/1997 | Dmitriev et al. | |
| 5,709,745 A | 1/1998 | Larkin et al. | |
| 5,888,887 A | 3/1999 | Li et al. | |
| 5,899,743 A | 5/1999 | Kai et al. | |
| 5,942,445 A | 8/1999 | Kato et al. | |
| 5,944,890 A | 8/1999 | Kitou et al. | |
| 5,954,881 A | 9/1999 | Burk, Jr. et al. | |
| 6,196,901 B1 | 3/2001 | Minami | |
| 6,352,927 B2 | 3/2002 | Kishimoto | |
| 6,534,026 B2 | 3/2003 | Vodakov et al. | |
| 6,562,127 B1 | 5/2003 | Kud et al. | |
| 6,579,359 B1 * | 6/2003 | Mynbaeva et al. | 117/94 |
| 6,583,050 B2 | 6/2003 | Wenski et al. | |
| 6,723,166 B2 | 4/2004 | Kuhn et al. | |
| 6,861,360 B2 | 3/2005 | Wenski et al. | |
| 6,899,762 B2 | 5/2005 | Wenski et al. | |
| 7,081,420 B2 | 7/2006 | Kamata et al. | |
| 7,294,324 B2 | 11/2007 | Powell et al. | |
| 7,314,520 B2 | 1/2008 | Powell et al. | |
| 7,314,521 B2 | 1/2008 | Powell et al. | |
| 7,316,747 B2 | 1/2008 | Jenny et al. | |
| 7,323,051 B2 | 1/2008 | Hobgood et al. | |
| 7,399,217 B1 | 7/2008 | Godshall | |
| 7,422,634 B2 | 9/2008 | Powell et al. | |
| 7,438,760 B2 * | 10/2008 | Bauer et al. | 117/89 |
| 7,449,065 B1 * | 11/2008 | Powell et al. | 117/84 |
| 7,513,819 B2 | 4/2009 | Kiuchi et al. | |
| 7,531,433 B2 * | 5/2009 | Ellison et al. | 438/478 |
| 7,935,614 B2 | 5/2011 | Schauer et al. | |
| 8,075,647 B2 | 12/2011 | Kawasaki et al. | |
| 8,221,549 B2 * | 7/2012 | Maruyama | 117/104 |
| 8,384,090 B2 | 2/2013 | Powell et al. | |
| 8,395,164 B2 | 3/2013 | Murphy et al. | |
| 8,435,866 B2 * | 5/2013 | Nishiguchi et al. | 438/458 |
| 8,436,366 B2 | 5/2013 | Harada et al. | |
| 2002/0083892 A1 | 7/2002 | Kondo et al. | |
| 2003/0070611 A1 | 4/2003 | Nakamura et al. | |
| 2004/0081805 A1 | 4/2004 | Furihata et al. | |
| 2004/0134418 A1 | 7/2004 | Hirooka | |
| 2004/0266057 A1 | 12/2004 | Nagasawa | |
| 2005/0059247 A1 | 3/2005 | Ikenaka | |
| 2006/0102068 A1 | 5/2006 | Tsvetkov et al. | |
| 2006/0107890 A1 | 5/2006 | Hobgood et al. | |
| 2006/0118037 A1 | 6/2006 | Powell et al. | |
| 2006/0249073 A1 | 11/2006 | Asaoka et al. | |
| 2006/0267024 A1 | 11/2006 | Murphy et al. | |
| 2006/0289873 A1 | 12/2006 | Rowland et al. | |
| 2007/0176531 A1 | 8/2007 | Kinoshita et al. | |
| 2007/0221614 A1 | 9/2007 | Sumakeris | |
| 2007/0262322 A1 | 11/2007 | Nakabayashi et al. | |
| 2007/0290211 A1 | 12/2007 | Nakayama et al. | |
| 2008/0008641 A1 | 1/2008 | Leonard et al. | |
| 2008/0220620 A1 | 9/2008 | Kawada et al. | |
| 2008/0261401 A1 | 10/2008 | Kerr et al. | |
| 2008/0318359 A1 | 12/2008 | Yonezawa et al. | |
| 2009/0038541 A1 | 2/2009 | Robbins et al. | |
| 2009/0114148 A1 | 5/2009 | Stahlbush et al. | |
| 2009/0124060 A1 | 5/2009 | Nagaya et al. | |
| 2009/0302328 A1 | 12/2009 | Ohno et al. | |
| 2009/0321747 A1 | 12/2009 | Murphy et al. | |
| 2009/0324896 A1 | 12/2009 | Kato | |
| 2010/0080956 A1 | 4/2010 | Fujimoto et al. | |
| 2010/0119849 A1 | 5/2010 | Nakamura et al. | |
| 2010/0291756 A1 | 11/2010 | Haeberlen et al. | |
| 2010/0295059 A1 | 11/2010 | Fujimoto et al. | |
| 2011/0031505 A1 | 2/2011 | Harada et al. | |
| 2011/0206929 A1 | 8/2011 | Nakabayashi et al. | |
| 2011/0233562 A1 | 9/2011 | Harada et al. | |
| 2011/0237078 A1 | 9/2011 | Hirooka | |
| 2011/0284871 A1 * | 11/2011 | Harada et al. | 257/77 |
| 2012/0025153 A1 | 2/2012 | Hirose et al. | |
| 2012/0031330 A1 | 2/2012 | Tsumori et al. | |
| 2012/0060751 A1 | 3/2012 | Urakami et al. | |
| 2012/0061686 A1 * | 3/2012 | Nishiguchi et al. | 257/77 |
| 2012/0070605 A1 | 3/2012 | Sasaki et al. | |
| 2012/0070968 A1 | 3/2012 | Shibagaki et al. | |
| 2012/0103249 A1 | 5/2012 | Gupta et al. | |
| 2012/0128892 A1 | 5/2012 | Toyoda et al. | |
| 2012/0184113 A1 | 7/2012 | Inoue et al. | |
| 2012/0241766 A1 | 9/2012 | Ohtsuka et al. | |
| 2012/0248463 A1 | 10/2012 | Zhang | |
| 2012/0285370 A1 | 11/2012 | Gupta et al. | |
| 2013/0020585 A1 | 1/2013 | Ishibashi | |
| 2013/0029158 A1 | 1/2013 | Aigo et al. | |
| 2013/0032822 A1 | 2/2013 | Ishibashi | |
| 2013/0071643 A1 | 3/2013 | Harada et al. | |
| 2013/0122692 A1 | 5/2013 | Imai et al. | |
| 2014/0054619 A1 | 2/2014 | Burk et al. | |

FOREIGN PATENT DOCUMENTS

| | | |
|---|---|---|
| CN | 102569055 | 7/2012 |
| CN | 102899723 | 1/2013 |
| DE | 102009016132 | 10/2010 |
| EP | 0712150 | 5/1996 |
| EP | 0795050 | 7/1999 |
| EP | 0967304 | 12/1999 |
| EP | 1039512 | 3/2000 |
| EP | 1179620 | 2/2002 |
| EP | 0954623 | 5/2002 |
| EP | 1215730 | 6/2002 |
| EP | 1225257 | 7/2002 |
| EP | 1288346 | 8/2002 |
| EP | 1255281 | 11/2002 |
| EP | 1306890 | 5/2003 |
| EP | 1354987 | 10/2003 |
| EP | 1403404 | 3/2004 |
| EP | 1143033 | 9/2004 |
| EP | 1491662 | 12/2004 |
| EP | 1243674 | 6/2005 |
| EP | 1659198 | 5/2006 |
| EP | 1739726 | 1/2007 |
| EP | 1785512 | 5/2007 |
| EP | 1852527 | 11/2007 |
| EP | 1855312 | 11/2007 |
| EP | 1751329 | 1/2008 |
| EP | 1901345 | 3/2008 |
| EP | 1828446 | 3/2010 |
| EP | 1721031 | 11/2010 |
| EP | 2264223 | 12/2010 |
| EP | 2314737 | 4/2011 |
| EP | 1752567 | 9/2011 |
| EP | 2371997 | 10/2011 |
| EP | 2385158 | 11/2011 |
| EP | 2394787 | 12/2011 |
| EP | 2395133 | 12/2011 |
| EP | 2405038 | 1/2012 |
| EP | 2420599 | 2/2012 |
| EP | 2484815 | 8/2012 |
| EP | 2490247 | 8/2012 |
| EP | 2557205 | 2/2013 |
| EP | 1797225 | 3/2013 |
| EP | 2570522 | 3/2013 |
| EP | 2584594 | 4/2013 |
| EP | 1790757 | 8/2013 |
| JP | H05-262599 | 10/1993 |
| JP | H06-316499 | 11/1994 |
| JP | 2003086518 | 3/2003 |
| JP | 2003086816 | 3/2003 |
| JP | 2004099340 | 4/2004 |
| JP | 2004292305 | 10/2004 |
| JP | 2005051299 | 2/2005 |
| JP | 2005064392 | 3/2005 |
| JP | 2006066722 | 3/2006 |
| JP | 2006120897 | 5/2006 |
| JP | 2007080770 | 3/2007 |
| JP | 2007131504 | 5/2007 |
| JP | 2007230823 | 9/2007 |
| JP | 2008001537 | 1/2008 |

(56) References Cited

FOREIGN PATENT DOCUMENTS

| JP | 2008004888 | 1/2008 |
|---|---|---|
| JP | 2008053343 | 3/2008 |
| JP | 2008074661 | 4/2008 |
| JP | 2008115034 | 5/2008 |
| JP | 2009182126 | 8/2009 |
| JP | 2010228939 | 10/2010 |
| JP | 2010254520 | 11/2010 |
| JP | 2011020860 | 2/2011 |
| JP | 2011073915 | 4/2011 |
| JP | 2011233932 | 11/2011 |
| JP | 2012028565 | 2/2012 |
| JP | 2012246168 | 12/2012 |
| JP | 2013014469 | 1/2013 |
| KR | 100845946 | 7/2008 |
| WO | WO 9301914 | 2/1993 |
| WO | WO 9713013 | 4/1997 |
| WO | WO 0068474 | 11/2000 |
| WO | WO 0079570 | 12/2000 |
| WO | WO 0218670 | 3/2002 |
| WO | WO 2004014607 | 2/2004 |
| WO | WO 2005111277 | 11/2005 |
| WO | WO 2006031641 | 3/2006 |
| WO | WO 2006108191 | 10/2006 |
| WO | WO 2006135476 | 12/2006 |
| WO | WO 2007035570 | 3/2007 |
| WO | WO 2007058774 | 5/2007 |
| WO | WO 2007148486 | 12/2007 |
| WO | WO 2008033994 | 3/2008 |
| WO | WO 2008039914 | 4/2008 |
| WO | WO 2009003100 | 12/2008 |
| WO | WO 2009075935 | 6/2009 |
| WO | WO 2009080177 | 7/2009 |
| WO | WO 2009120505 | 10/2009 |
| WO | WO 2010041497 | 4/2010 |
| WO | WO 2010111473 | 9/2010 |
| WO | WO 2011034850 | 3/2011 |
| WO | WO 2011/083552 | 7/2011 |
| WO | WO 2011126145 | 10/2011 |
| WO | WO 2011149906 | 12/2011 |
| WO | WO 2012067112 | 5/2012 |
| WO | WO 2012144614 | 10/2012 |
| WO | WO 2013062380 | 5/2013 |

OTHER PUBLICATIONS

Chung, G., et al. "4H—SiC Epitaxy with Very Smooth Surface and Low Basal Plane Dislocation on 4 Degree Off-Axis Wafer." Materials Science Forum 679-680 (2011): 123-126.

Dmitriev, V., et al. "Growth of SiC and SiC—AlN solid solution by container-free liquid phase epitaxy." Journal of crystal growth 128.1 (1993): 343-348.

Gupta, A., et al. "Status of Large Diameter SiC Single Crystals." Materials Science Forum 717-720 (2012): 3-8.

Gutkin, M., et al. "Micropipe Reactions in Bulk SiC Growth." Silicon Carbide—Materials, Processing and Applications in Electronic Devices (2011): 187-206.

Hecht, C., et al. "High-Performance Multi-Wafer SiC Epitaxy—First Results of Using a 10×100mm Reactor." Materials Science Forum 645-648 (2010): 89-94.

Hull, B., et al., "Development of Large Area (up to 1.5 cm2) 4H—SiC 10 kV Junction Barrier Schottky Rectifiers." Materials Science Forum 600-603 (2008): 931-934.

Ioffe Physico-Technical Institute. "Electronic archive. New Semiconductor Materials Characteristics and Properties. NSM Archive—Silicon Carbide (SiC)." http://www.ioffe.ru/SVA/NSM/Semicond/ accessed Aug. 29, 2013 (1998-2001): 1-72.

Kimoto, T., et al. "Homoepitaxial Growth of 4H—SiC (033¯8) and Nitrogen Doping By Chemical Capor Deposition." Journal of crystal growth 249.1 (2003): 208-215.

Larkin, D., et al. "Site-Competition Epitaxy for Superior Silicon Carbide Electronics." Applied Physics Letters 65.13 (1994): 1659-1661.

Lendenmann, H., et al. "Operation of a 2500V 150A Si-IGBT / SiC Diode Module." Materials Science Forum 338-342 (2000): 1423-1426.

Maximenko, S., et al. "Open Core Dislocations and Surface Energy of SiC." Materials Science Forum 527-529 (2006): 439-442.

Mynbaeva, M., et al. "Chemical Vapor Deposition of 4H—SiC Epitaxial Layers on Porous SiC Substrates." Applied Physics Letters 78.1 (2001): 117-119.

Neudeck, P. "Electrical Impact of SiC Structural Crystal Defects on High Electric Field Devices." Materials Science Forum 338-342 (2000): 1161-1166.

Neudeck, P., et al. "Performance Limiting Micropipe Defects in Silicon Carbide Wafers." Electron Device Letters, IEEE 15.2 (1994): 63-65.

Ogunniyi, A., et al. "The Benefits and Current Progress of SiC SGTOs for Pulsed Powers Applications." Solid-State Electronics 54.10 (2010): 1232-1237.

Powell, A., et al. "Large Diameter 4H—SiC Substrates for Commercial Power Applications." Materials Science Forum 457-460 (2004): 41-46.

Powell, J., et al. "Process-Induced Morphological Defects in Epitaxial CVD Silicon Carbide." Physica status solidi (b) 202.1 (1997): 529-548.

Powell, J., et al. "Sources of Morphological Defects in SiC Epilayers." Trasactions Third International High-Temperature Electronics Conference, Sandia National Laboratories 1 (1996): II-3-II-8.

Sanchez, E., et al. "Thermal Decomposition Cavities in Physical Vapor Transport Grown SiC." Materials Science Forum 338.1 (2000): 55-58.

Schulze, N., et al. "Near-Equilibrium Growth of Micropipe-Free 6H—SiC Single Crystals by Physical Vapor Transport." Applied Physics Letters 72.13 (1998): 1632-1634.

Tairov, Y., et al. "General Principles of Growing Large-Size Single Crystals of Various Silicon Carbide Polytypes." Journal of Crystal Growth 52 (1981): 146-150.

Tairov, Y., et al. "Progress in Controlling the Growth of Polytypic Crystals." Progress in Crystal Growth and Characterization 7.1 (1983): 111-162.

Thomas, B., et al. "Properties and Suitability of 4H—SiC Epitaxial Layers Grown at Different CVD Systems for High Voltage Application." Materials Science Forum 457-460 (2004): 181-184.

Tupitsyn, E., et al. "Controllable 6H—SiC to 4H—SiC Polytype Transformation During PVT Growth." Journal of Crystal Growth 299.1 (2007): 70-76.

Wagner, G., et al. "Vapour Phase Growth of Epitaxial Silicon Carbide Layers." Progress in Crystal Growth and Characterization of Materials 47.2 (2003): 139-165.

Wan, J., et al. "A Comparative Study of Micropipe Decoration and Counting in Conductive and Semi-Insulating Silicon Carbide Wafers." Journal of Electronic Materials. 34.10 (2005): 1342-1348.

Wan, J., et al. "A New Method of Mapping and Counting Micropipes in SiC Wafers." Materials Science Forum 527-529 (2006): 447-450.

Wan, J., et al. "Scaling of Chlorosilane SiC CVD to Multi-Wafer Epitaxy System." Materials Science Forum 556-557 (2007): 145-148.

Wolf, S., et al. Silicon Processing for the VLSI Era. vol. 1—Process Technology. Ch. 1: Silicon: Single-Crystal Growth and Wafering (1986): 1-35.

Zhou, L., et al. "Chemomechanical Polishing of Silicon Carbide." Journal of the Electrochemical Society 144.6 (1997): L161-L163.

Levinshtein, M., et al. (eds.). Properties of Advanced Semiconductor Materials: GaN, AlN, InN, BN, SiC, SiGe. Ch. 5: Silicon Carbide (SiC) (2001): 93-147.

International Application No. PCT/US2013/059064, International Search Report and Written Opinion, Nov. 18, 2013.

Yashiro, H., et al. "Development of Lapping and Polishing Technologies of 4H—SiC Wafers for Power Device Applications." Materials Science Forum 600-603 (2009): 819-822.

International Application No. PCT/US2013/058996, international Search Report and Written Opinion, Nov. 27, 2013.

International Application No. PCT/US2013/077189, International Search Report and Written Opinion, Mar. 21, 2014.

(56) References Cited

OTHER PUBLICATIONS

Chen, W., and M. A. Capano. "Growth and characterization of 4H—SiC epilayers on substrates with different off-cut angles." Journal of applied physics 98.11 (2005): 114907.

International Application No. PCT/US2013/077285, International Search Report and Written Opinion, Apr. 7, 2014.
International Application No. PCT/US2013/077291, International Search Report and Written Opinion, Apr. 4, 2014.

* cited by examiner

HIGH VOLTAGE POWER SEMICONDUCTOR DEVICES ON SIC

CROSS-REFERENCE TO RELATED APPLICATIONS

This application claims the benefit of, and priority to, U.S. Provisional Patent Application No. 61,699,797, filed on Sep. 11, 2012, entitled "High Voltage Power Semiconductor Devices on SiC," the entire disclosure of which is hereby incorporated herein by reference.

STATEMENT REGARDING FEDERALLY SPONSORED RESEARCH OR DEVELOPMENT

This invention was made with Government support under contract DAAD19-01-C-0067 awarded by Army Research Laboratory. The Government may have certain rights in the invention.

BACKGROUND

1. Field

This disclosure relates to semiconductor devices and, specifically to high power semiconductor devices fabricated on silicon carbide substrates.

2. Related Arts

Semiconductor SiC can be used to build semiconductor devices that operate at voltages in the range of 600-10000V and higher. Crystalline originated defects such as micropipes, screw dislocations and basal plane dislocations are present in significant quantities in SiC substrates and will become incorporated into the active region of a semiconductor device made with this material. The defects alone and together are believed to be limiting the operational performance and stability of semiconductor SiC devices with respect to that predicted from theory, and the effects of these defects become more pronounced when the devices are designed to operate at very high end of the voltage range.

Silicon carbide, SiC, is a crystalline semiconductor material, recognized by those familiar with materials science, electronics and physics as being advantageous for wide band gap properties and also for extreme hardness, high thermal conductivity and chemical inert properties. These properties make SiC a very attractive semiconductor for fabrication of power semiconductor devices, enabling power density and performance enhancement over devices made from more common materials like silicon. There are many published summaries of the properties of SiC. For example, the properties of SiC are compiled by the Ioffe Institute and published online as "Electronic archive. New Semiconductor Materials. Characteristics and Properties." (1998-2001). Common SiC materials constants values published by Ioffe are often used in device modeling activities. See, also, "Handbook Series on Semiconductor Parameters" vol. 1, 2 edited by M. Levinstein, S. Rumyantsev and M. Shur, World Scientific, London, 1996, 1999.

The most common forms of SiC consist of cubic or hexagonal arrangements of atoms. The stacking of Si and C layers can take on many forms, known as polytypes. The type of silicon carbide crystal is denoted by a number denoting the number of repeat units in the stacking sequence followed by a letter representing the crystalline format. For example the 3C-SiC polytype refers to a repeat unit of 3 and a cubic (C) lattice, while a 4H-SiC polytype refers to repeat unit of 4 and a hexagonal (H) lattice.

The different silicon carbide polytypes have some variations in materials properties, most notably electrical properties. The 4H-SiC polytype has the relatively larger bandgap while the 3C-SiC has a smaller bandgap, with the bandgaps for most other polytypes falling in between. For high performance power device applications when the bandgap is larger, the material is more capable, in theory, to offer relatively higher high power and thermal conductivity performance.

SiC crystals do not occur in nature and as such must be synthesized. Growth of SiC crystals can be executed by sublimation/physical vapor transport or chemical vapor deposition.

Growth of SiC by sublimation is very challenging. Temperatures in excess of 2000° C. are required to generate as vapor stream of Si/C species by sublimation, which places great limitations on the reaction cell components and the furnace design. Originally SiC abrasive materials formed by processes like the Acheson method were used as the source of the Si and C atoms for the crystal, and as the technology matured groups developed means to synthesize SiC source powder specifically for SiC crystal growth. The growth is usually performed in a graphite container within a vacuum chamber. The graphite container is heated by either resistive methods or induction methods. The container is insulated in a careful manner as to create controlled temperature gradients within the volume. A seed crystal is used and usually shaped like a plate or disc. The seed crystal is typically oriented with its growth surface facing the source material. The location of the seed crystal in the container is designed such that when the container is heated the seed is at a relatively lower temperature position, while the Si—C source materials are at the higher temperature position. When the container is heated to a temperature sufficient to sublime the source material, the vapors will travel towards the low temperature region and condense on the seed crystal. While this appears simple in concept, in practice the growth of SiC is very complicated and recognized by those who practice as very difficult to perform.

Historically, initial progress in SiC sublimation-based crystal growth is described first by Lely (U.S. Pat. No. 2,8543, 64—1958) whose method of unseeded crystal growth resulted in small hexagonal SiC platelets. In the 1970s and 1980s the art to produce the first crystals of size attractive for producing devices was done in Russia by Tairov and Tsvetkov (Journal of Crystal Growth, 52 (1981) p. 146-50 and Progress in Controlling the Growth of Polytypic Crystals in Crystal Growth and Characterization of Polytype Structures, P. Krishna, ed., Pergammon Press, London, p. 111 (1983)). Their approach used a Lely crystal as a seed, and conducted growth by sublimation and transport as described above. These results showed methods for polytype control by choice of seeds, pressure control and temperature gradients. Later, Davis (U.S. Pat. No. 4,866,005—1989) revealed improvements by judicious selection of source materials and gradient controls. Refinements on the methods of Tairov, Tsvetkov and Davis continue to be revealed to this day.

When methods to produce larger crystals emerged, focus also moved to control defects in the crystals. Defects can be categorized as inclusions and crystal dislocations. The primary crystalline defects in SiC crystals are screw dislocations. Among these are a special case known as a micropipe or hollow core screw dislocations. Additionally, there are basal plane dislocations and threading edge dislocations. These defects originate from many sources. For example, defects contained in the seed crystal can be passed to the newly grown crystal volume. Stresses arising from temperature gradients and thermal expansion mismatch and imparted to the seed and crystal during growth can result in formation of dislocations.

Deviation of the stoichiometry in the sublimation vapor stream from that needed to form SiC can result in unstable polytype growth—in turn leading to polytype inclusions in the grown crystal, which lead to dislocation formation at the polytype boundaries. Even interactions between dislocations can create or eliminate dislocations.

SiC crystals produced by methods identified have large concentrations of dislocations. As of this filing, the commonly reported values of screw dislocation and basal plane concentration are nominally 5000-10000/cm$^2$, respectively. The dislocations are most commonly assessed by sectioning the crystal in the plane normal to the crystal axis of symmetry. Etching the exposed crystal surface with molten salt, like potassium hydroxide, at temperatures in the 350-500° C. range will reveal the dislocations which cross the plane of the substrate. Each dislocation type has a unique shape so they can be uniquely counted. The dislocations are commonly counted and reported as a number divided by the inspection area. This characterization method is useful as it allows for easy identification of defects revealed by etching which are present in the active region of semiconductor devices formed on the substrate plane. These defects, or the lack thereof, are often correlated with the electrical operation parameters of the device. There are many examples in the literature which show that dislocations are not uniformly distributed. The large count of dislocations makes it very impractical to count every single one, especially as today inspections can be required on sections greater than or equal to the equivalent of 100 mm diameter circles. So while the entire substrate area may be etched, only the limited part of the surface which is sampled for inspection will determine the amount of dislocations assigned to the part. Incorrect sampling methods can lead to errors in the estimation of the dislocation concentration associated with larger crystals. In most reports, the details of the sampling method are not provided, so replication of results can often be difficult, if not impossible.

Scientists experienced in solid state physics and semiconductor devices know that dislocations result in device performance below the theoretical properties of the material. Therefore modern effort focused on improvements of semiconductor SiC crystal quality look to identify and control the factors which can reduce defects originating in crystal growth.

Once large enough crystals are produced the crystal must be cut and fabricated into wafers in order to be useful in devices to fabricate semiconductor devices using planar fabrication methods. As many semiconductor crystals (e.g., silicon, gallium arsenide) have been successfully developed and commercialized into wafer products the methods to fabricate wafers from bulk crystals are known. A review of the common approaches to, and requirements for wafer fabrication and standard methods of characterization can be found in Wolf and Tauber, Silicon Processing for the VLSI Era, Vol. 1—Process Technology, Chapter 1 (Lattice Press—1986).

Due to its hardness, fabrication of SiC into wafer substrates presents unique challenges compared to processing other common semiconductor crystals like silicon or gallium arsenide. Modifications must be made to the machines and the choices of abrasives changed beyond commonly used materials. The modifications made on common wafer fabrication techniques in order to accommodate SiC are often kept as proprietary information by their inventors. It has been reported that substantial subsurface damage is observable on mirror polished SiC wafers, and this can be reduced or removed by using chemical enhanced mechanical polishing methods similar to that used in the silicon industry (Zhou, L., et al., Chemomechanical Polishing of Silicon Carbide, J. Electrochem. Soc., Vol. 144, no. 6, June 1997, pp. L161-L163).

In order to build semiconductor devices on SiC wafers additional crystalline SiC films must be deposited on the wafers to create the device active regions with the required conductivity value and conductor type. This is typically done using chemical vapor deposition (CVD) methods. Techniques for growth of SiC by CVD epitaxy have been published from groups in Russia, Japan and the United States since the 1970's. The most common chemistry for growth of SiC by CVD is a mixture of a silicon containing source gas (e.g., monosilanes or chlorosilanes) and a carbon containing source gas (e.g., a hydrocarbon gas). A key element to growth of low defect epitaxial layers is that the substrate surface is tilted away from the crystal axis of symmetry to allow the chemical atoms to attach to the surface in the stacking order established by the substrate crystal. When the tilt is not adequate the CVD process will produce three dimensional defects on the surface, and such defects will result non-operational semiconductor devices. Surface imperfections, such as cracks, subsurface damage, pits, particles, scratches or contamination will interrupt the replication of the wafer's crystal structure by the CVD process (see, for example, Powell and Larkin, Phys. Stat. Sol. (b) 202, 529 (1997)). It is important that the polishing and cleaning processes used to fabricate the wafer minimize surface imperfections. In the presence of these surface imperfections several defects can be generated in the epitaxial films including basal plane dislocations and cubic SiC inclusions (see for example, Powell, et. al. Transactions Third International High-Temperature Electronics Conference, Volume 1, pp. II-3-II-8, Sandia National Laboratories, Albuquerque, N. Mex. USA, 9-14 June 1996).

Defects in SiC are known to limit or destroy operation of semiconductor devices formed over the defects. Neudeck and Powell reported that hollow core screw dislocations (micropipes) severely limited voltage blocking performance in SiC diodes (P. G. Neudeck and J. A. Powell, IEEE Electron Device Letters, vol. 15, no. 2, pp. 63-65, (1994)). Neudeck reviewed the impact of crystal (wafer) and epitaxy originated defects on power devices in 1994 highlighting limitations of power device function due to screw dislocations and morphological epitaxy defects (Neudeck, Mat. Sci. Forum, Vols 338-342, pp. 1161-1166 (2000)). Hull reported shift to lower values in the distribution of high voltage diode reverse bias leakage current when the diodes were fabricated on substrates having lower screw dislocation density (Hull, et. al., Mat. Sci. forum, Vol. 600-603, p. 931-934 (2009)). Lendenmann reported forward voltage degradation in bipolar diodes was linked to basal plane dislocations in the epilayer that originate from basal plane dislocations in the substrate (Lendenmann et. al., Mat. Sci. Forum, Vols 338-342, pp. 1161-1166 (2000)). In order to realize the potential performance advantages of SiC devices, the defects in the active device area must be reduced to levels where they are effectively benign.

As most defects originate in the bulk crystal, many researchers have tried to develop epitaxy processes which can inhibit propagation of the defects like basal plane dislocations from the substrate to the epitaxial films. The techniques included chemical etching of the substrate surface prior to CVD growth, strategic alterations to the CVD process and combinations thereof. In the case of propagation of basal plane dislocations from the polished substrate into the epitaxial layers, these dislocations are either converted to threading edge dislocations, which are relatively benign to semiconductor device operation or the basal plane dislocation will extend into the epitaxial layers. Reduction of basal plane dislocations is enhanced by several approaches including lowering the tilt angle of the wafer, altering the polishing process, altering the CVD process parameters. For example US 2009/0114148 A1 teaches that interrupting the CVD process can have a positive impact on reducing the number basal plane dislocations in the epitaxial layer. US2010/0119849 A1 teaches the use of liquid phase epitaxy as a means to suppress defect reduction in the epitaxial layer. US2007/0221614 A1 combines etching and re-polishing of the substrate and epitaxy to suppress basal plane defects in the epitaxial layer. The typical limitation of these and similar techniques is that they do not work simultaneously on all types of defects and, particularly when starting with substrates with high defect density, they to not reduce the defects to levels where they are benign with respect to the performance of the semiconductor device.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments provide methods for manufacturing a high voltage (Voltages of greater than 600 V) semiconductor device, which is comprised of a 4H-SiC substrate of area 0.02-1.5 cm$^2$, with micropipe density less than 1/cm$^2$ and screw dislocation density less than 2000/cm$^2$ and basal plane dislocation density less than 2000/cm$^2$ and several SiC epitaxy film layers on this substrate with at least one having a net carrier concentration in the range from $1\times10^{14}$/cm$^3$ to $2\times10^{16}$/cm$^3$ and micropipe density measured at the top of the epitaxy layers less than 1/cm$^2$ and screw dislocation density measured at the top of the epitaxy layers less than 2000/cm$^2$ and basal plane dislocation density measured at the top of the epitaxy layers less than 50/cm$^2$. Epitaxial layers formed can be either n type or p type, designating the conductivity type as electrons or holes. A high voltage device can be comprised of one or both conductivity types of epitaxial layers.

According to aspects of the invention, a semiconductor device is comprised of a 4H-SiC substrate of area 0.02-1.5 cm$^2$, with micropipe density less than 1/cm$^2$ and screw dislocation density less than 2500/cm$^2$ and basal plane dislocation density less than 2500/cm$^2$ and several SiC epitaxy film layers on this substrate with at least one having a net carrier concentration in the range from $1\times10^{14}$/cm$^3$ to $2\times10^{16}$/cm$^3$ and micropipe density measured at the top of the epitaxy layers less than 1/cm$^2$ and screw dislocation density measured at the top of the epitaxy layers less than 2500/cm$^2$ and basal plane dislocation density measured at the top of the epitaxy layers less than 10/cm$^2$ and at least one epitaxial layer with carrier lifetime less than 1 μsec. The device shows reverse voltage blocking in the range of 85-95% of the theoretical value determined by modeling the device using common SiC materials constants.

In one aspect, provided herein is a high voltage semiconductor device comprising: a 4H-SiC substrate having an area of 0.02 to 1.5 cm$^2$ having: a micropipe density of less than 1/cm$^2$, a screw dislocation density of less than 2000/cm$^2$, and a basal plane dislocation density of less than 2000/cm$^2$; and a plurality of epitaxial layers over the substrate, wherein at least one of the plurality of epitaxial layers has: a net carrier concentration in the range from $1\times10^{14}$/cm$^3$ to $2\times10^{16}$/cm$^3$, a micropipe density of less than 1/cm$^2$, a screw dislocation density of less than 2000/cm$^2$, and a basal plane dislocation density of less than 10/cm$^2$.

In one embodiment of this aspect, the device further comprises at least one p-n junction formed by two adjacent epitaxial layers.

In another embodiment of this aspect, the device further comprises at least one epitaxial layer with carrier lifetime of more than 1 microsecond.

In another embodiment of this aspect, reverse bias blocking voltage, represented as the maximum voltage measured at a leakage current of less than or equal to 10 mA/cm$^2$, is in the range of more than 85% of the theoretical value determined by modeling the device using SiC materials constants.

In another embodiment of this aspect, the 4H-SiC substrate is a single crystal 4H-SiC substrate.

In another embodiment of this aspect, the single crystal 4H-SiC substrate is cut at an angle tilted away from the c-axis.

In another embodiment of this aspect, the single crystal 4H-SiC substrate is cut at an angle tilted toward the <11-20> direction.

In another aspect, provided herein is a method for manufacturing a semiconductor device, comprising: manufacturing a 4H-SiC substrate having: a micropipe density of less than 1/cm$^2$, a screw dislocation density of less than 2000/cm$^2$, and a basal plane dislocation density of less than 2000/cm$^2$; and depositing a plurality of epitaxial layers over the substrate, wherein at least one of the plurality of epitaxial layers has: a net carrier concentration in the range from $1\times10^{14}$/cm$^3$ to $2\times10^{16}$/cm$^3$, and a micropipe density of less than 1/cm$^2$, a screw dislocation density of less than 2000/cm$^2$, and a basal plane dislocation density of less than 10/cm$^2$.

In one embodiment of this aspect, the step of depositing the plurality of epitaxial layers further comprises forming at least one p-n junction.

In another embodiment of this aspect, the 4H-SiC substrate is a single crystal 4H-SiC substrate.

In another embodiment of this aspect, the single crystal 4H-SiC substrate is cut at an angle tilted away from the c-axis.

In another embodiment of this aspect, the single crystal 4H-SiC substrate is cut at an angle tilted toward the <11-20> direction.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale. In the drawings, where like reference numerals refer to like features in the specification.

DETAILED DESCRIPTION

Figure 1:
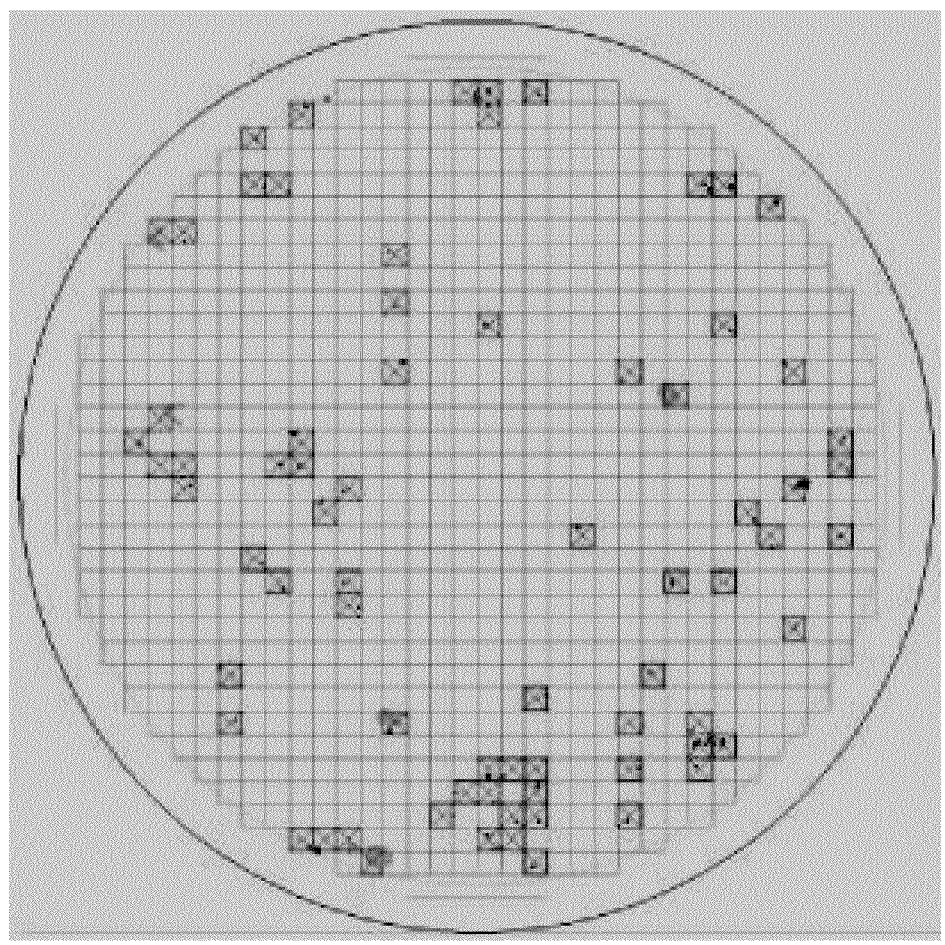
FIG. 1 is an LLS defect site map of a 100 μm thick epi wafer with LLS 2×2 mm site yield of 92%, corresponding to a defect density of 1.9 cm$^{-2}$.

It should be understood that this invention is not limited to the particular methodology, protocols, etc., described herein and as such may vary. The terminology used herein is for the purpose of describing particular embodiments only, and is not intended to limit the scope of the present invention, which is defined solely by the claims.

As used herein and in the claims, the singular forms include the plural reference and vice versa unless the context clearly indicates otherwise. Other than in the operating examples, or where otherwise indicated, all numbers expressing quantities used herein should be understood as modified in all instances by the term "about."

All publications identified are expressly incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

Unless defined otherwise, all technical and scientific terms used herein have the same meaning as those commonly understood to one of ordinary skill in the art to which this invention pertains. Although any known methods, devices, and materials may be used in the practice or testing of the invention, the methods, devices, and materials in this regard are described herein.

Some Selected Definitions

Unless stated otherwise, or implicit from context, the following terms and phrases include the meanings provided below. Unless explicitly stated otherwise, or apparent from context, the terms and phrases below do not exclude the meaning that the term or phrase has acquired in the art to which it pertains. The definitions are provided to aid in describing particular embodiments of the aspects described herein, and are not intended to limit the claimed invention, because the scope of the invention is limited only by the claims. Further, unless otherwise required by context, singular terms shall include pluralities and plural terms shall include the singular.

As used herein the term "comprising" or "comprises" is used in reference to compositions, methods, and respective component(s) thereof, that are essential to the invention, yet open to the inclusion of unspecified elements, whether essential or not.

As used herein the term "consisting essentially of" refers to those elements required for a given embodiment. The term permits the presence of additional elements that do not materially affect the basic and novel or functional characteristic(s) of that embodiment of the invention.

The term "consisting of" refers to compositions, methods, and respective components thereof as described herein, which are exclusive of any element not recited in that description of the embodiment.

Other than in the operating examples, or where otherwise indicated, all numbers expressing quantities used herein should be understood as modified in all instances by the term "about." The term "about" when used in connection with percentages may mean±1%.

The singular terms "a," "an," and "the" include plural referents unless context clearly indicates otherwise. Similarly, the word "or" is intended to include "and" unless the context clearly indicates otherwise. Thus for example, references to "the method" includes one or more methods, and/or steps of the type described herein and/or which will become apparent to those persons skilled in the art upon reading this disclosure and so forth.

Although methods and materials similar or equivalent to those described herein can be used in the practice or testing of this disclosure, suitable methods and materials are described below. The term "comprises" means "includes." The abbreviation, "e.g." is derived from the Latin exempli gratia, and is used herein to indicate a non-limiting example. Thus, the abbreviation "e.g." is synonymous with the term "for example."

To the extent not already indicated, it will be understood by those of ordinary skill in the art that any one of the various embodiments herein described and illustrated may be further modified to incorporate features shown in any of the other embodiments disclosed herein.

The following examples illustrate some embodiments and aspects of the invention. It will be apparent to those skilled in the relevant art that various modifications, additions, substitutions, and the like can be performed without altering the spirit or scope of the invention, and such modifications and variations are encompassed within the scope of the invention as defined in the claims which follow. The following examples do not in any way limit the invention.

The following provides examples of fabrication methods according to embodiments of the invention, which result in high power device on a SiC substrate. The various methods provide substrates having the required specifications to obtain a highly functional device.

Embodiments disclosed herein provide epiwafers with thickness of 50-100 µm, grown on 4° off-axis 76 mm 4H SiC substrates. Smooth surface with RMS roughness below 1 nm and defect density down to 2 cm$^{-2}$ are achieved for 80-100 µm thick epiwafers. Long carrier lifetime of 2-4 µs are routinely obtained, and low BPD density in the range of 50 down to below 10 cm$^{-2}$ is confirmed. High voltage JBS diodes have been successfully fabricated on these wafers with thick epitaxial layers.

High voltage diodes and transistors fabricated on high quality 4H SiC are suited for new technology markets to control power and reduce energy consumption. Recent progress in the fabrication of 4H-SiC crystals and wafers has resulted in micropipe defect density of less than 0.1/cm$^2$, screw dislocation densities <2500/cm$^2$, and basal plane defect density less than 1000/cm$^2$. CVD epitaxy on these substrates has produced SiC epiwafers with smooth surfaces and low basal plane defect density. Various embodiments enable to produce low doped (less than $1\times10^{15}$/cm$^3$) epiwafers with thickness of 50-100 µm on 3-in 4° off-axis substrates.

Prior to CVD epitaxy, the number of micropipes detected at the near surface of the 4H-SiC wafer is measured and then mapped using laser light scattering. The micropipe density is calculated by dividing the total count of micropipes by the area of the wafer surface measured. All wafers had micropipe density less than 0.5/cm$^2$ measured by laser light scattering spectroscopy. KOH etching or x-ray topography measurements are used to characterize dislocations. There is good agreement between the methods so the two tests can be used interchangeably. The results of the screw dislocation analysis revealed greater than 95% probability that a measured site would have a screw dislocation density less than 2500/cm$^2$. The results of the basal plane defect analysis revealed greater than 80% probability that a measured site would show a value of the basal planes intersecting the wafer surface corresponding to a density less than 2500/cm$^2$.

Epitaxial films are then grown on 3-in 4° off-axis 4H SiC substrates in a horizontal hot-wall CVD reactor. An SiC semiconductor device is typically fabricated using 2 or more layers of epitaxial film. Total epitaxy film thickness is measured by Fourier Transform Infrared Spectrometry (FTIR) and doping is obtained by mercury probe capacitance voltage (C-V) measurement. Surface defect inspection is obtained by Laser Light Scattering (LLS) mapping, and surface roughness is measured by Atomic Force Microcscopy (AFM). In addition, carrier lifetime is measured by microwave induced photoconductive decay (micro-PCD). The excitation laser wavelength is 349 nm, and the carrier injection level corresponds to $1 \times 10^{16}$ cm$^{-3}$. Basal plane dislocations (BPD) and screw dislocations in the composite epitaxial film are revealed by molten KOH etch at 500-550° C. for 5-10 minutes. This etch time corresponds to etching 1.5-3 µm of film away on the silicon face. On intact SiC wafers, the dislocation density is typically measured at 9 sites on the wafer, for example at the center, on four points on a circumference at 50% of the wafer radius and on four points on a circumference near the full wafer radius.

Each of micropipe density, screw dislocation density and basal plane dislocation density of a polished SiC substrate wafer or a SiC polished wafer including an epitaxial layer can be measured using KOH etching technique described above. Each of micropipe density, screw dislocation density and basal plane dislocation density contained in a SiC power semiconductor device can be measured by removing the device chip from its package and executing the KOH etch process described above. In the case to measure the dislocations on a single power device, the dislocations are counted in the area defined by the anode in the case of a diode or in the area region defined by the finger structure in transistor with vertical current flow like a MOSFET (source region) or BJT (emitter-base region).

The SiC epi development has focused on defect control through improving hot-zone parts design and stability as well as key process parameters. Using an optimized CVD chemistry, epiwafers with thickness up to 100 µm at intentional n-doping levels around $5 \times 10^{14}$ cm$^{-3}$ have been produced. At this thickness and low doping level, a reasonably low surface defect density has been obtained with a median value of 5.6 cm$^{-2}$ and best values below 2 cm$^{-2}$. FIG. 1 illustrates the LLS defect site map of a 100 micron (µm) thick epitaxy wafer with average n-doping of $4 \times 10^{14}$ cm$^{-3}$. The defect free site yield of the 100 µm thick epi wafer is 92%, corresponding to a defect density of 1.9 cm$^{-2}$. The optimized process has also consistently produced epiwafers with a smooth surface, even at thickness as high as 80-100 µm, as confirmed AFM roughness measurements. The RMS roughness of the 80-100 µm thick epi wafers is generally below 1 nm, as measured by AFM with a 20×20 µm$^2$ scan. However, a deviation from the smooth surface can be sometimes observed at locations close to the wafer edges. The carrier lifetime is measured with microwave photoconductive decay. On wafers with total epitaxy film thickness in the range of 20-100 µm, the average lifetime calculated from measurements on a wafer surface is typically 2 microseconds, and the within wafer standard deviation is typically 10-40%. As an example, the lifetime values measured on the surface of a 100 µm thick epilayer were range from 6-8 microseconds.

Figure 2A:
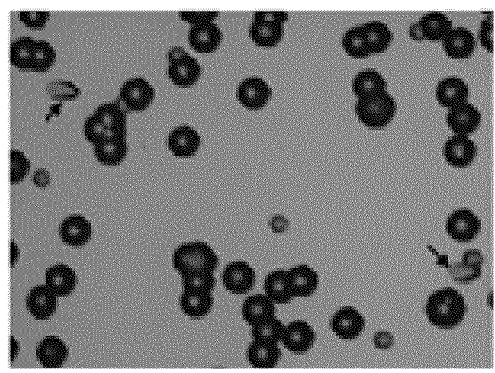
FIG. 2a illustrates Nomarski microscope image of KOH etched epi surface. Isolated BPDs are marked with arrows.
Figure 2B:
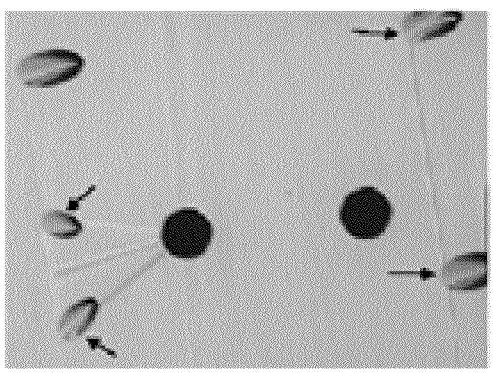
FIG. 2b illustrates Nomarski microscope image of KOH etched epi surface. BPDs associated with a triangle or a line defect are marked with arrows.

Molten KOH etch has been used to inspect the typical BPD density in a number of epilayers. The BPDs clearly revealed as shell shaped etch pits. Isolated basal plane dislocations can be observed, these are the result of basal plane dislocations in the polished wafer which are not converted to threading edge dislocations by the CVD epitaxy process. This is shown in FIG. 2a. Other basal plane defects found are associated with morphological defects like scratches, pits and particles; this is shown in FIG. 2b. Considering BPDs which are not associated with surface damage from polishing scratches, pits or particles, the surface inspection reveals an average BPD density in the epilayer is below 10 cm$^{-2}$.

Figure 3A:
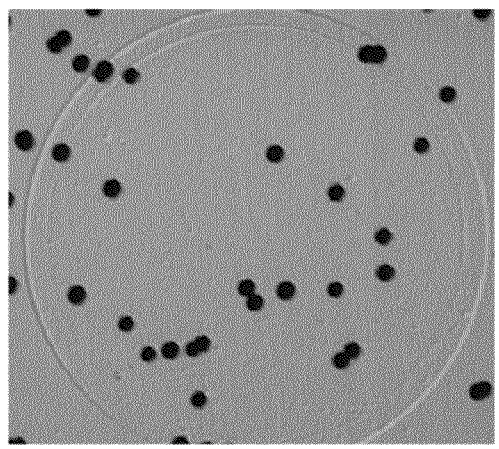
FIG. 3a illustrates Nomarski optical microscope images of KOH etched surface of (a): a JBS diode with blocking voltage of 1 kV
Figure 3B:
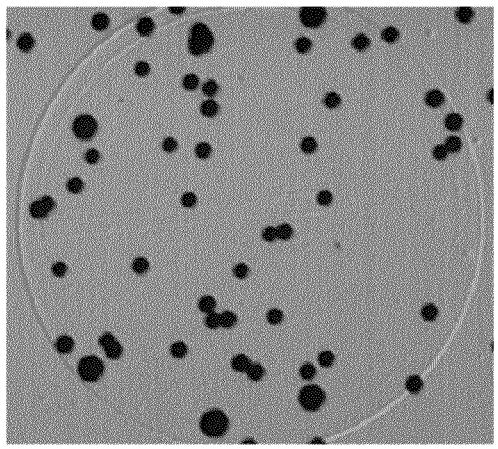
FIG. 3b illustrates a diode with blocking voltages of >10 kV. The black dots are threading screw (large pits) or threading edge dislocations (small pits) as revealed by KOH etch. No BPDs are observed in either of the diodes.
Figure 4:
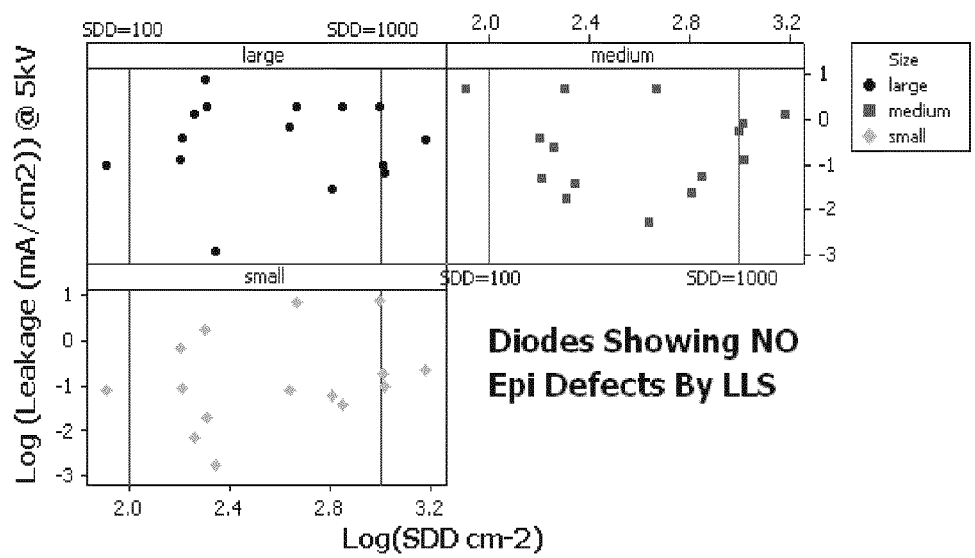
FIG. 4 illustrates leakage current versus screw dislocation density (SDD) in logarithmic scale on three different device sizes. No effect of screw dislocation density on reverse bias leakage current is observed.

JBS diodes with active areas ranging from 0.034 cm$^2$ to 0.474 cm$^2$ have been processed on the 4H-SiC epiwafers. Blocking voltages above 90% of the theoretical limit have been achieved on many of the JBS diodes. A blocking voltage as high as 8 kV has been obtained on diodes on 50 µm thick epitaxy, and 10 kV has been demonstrated on diodes on 80 µm thick epitaxy. Failure analysis and visual inspection on the devices after electrical testing shows that triangle defects are killer defects which limit the reverse bias performance. Diodes with a high reverse blocking voltage are free of any triangle defects. Etching in molten KOH was conducted on some of the devices after device testing. Only diodes free of morphological defects (e.g., triangles, particles, etc) were inspected. The diodes with disparate blocking voltages have been inspected under a Nomarski microscope. Screw dislocations appear as hexagonal features, basal plane dislocations appear as shells. As shown in FIGS. 3(a) and (b), the dislocation density does not differ in the diode with blocking voltage of 1 kV as compared with that in the diode with blocking voltage of more than 10 kV. Both diodes have an area of 0.18 cm$^2$, and not a single BPD is observed in either diode. An attempt has been made to examine potential correlation between the leakage current at a blocking voltage of 5 kV and the screw dislocation density contained in the active diode area for the 50 µm thick epiwafers. As shown in FIG. 4, no correlation can be observed. Similar observations were revealed for the diodes fabricated on substrates with 80 µm thick epitaxial films.

As shown above, 4H SiC epiwafers with thickness of 50-100 µm are grown on 4° off-axis substrates. Surface defect density in the range of 2-6 cm$^{-2}$ is obtained from LLS testing. Consistent carrier lifetime in the range of 2-3 µs has been obtained on these epiwafers. Very low BPD density has been confirmed in the epiwafers with BPD density down to below 10 cm$^{-2}$. Epitaxial wafers with thickness of 50-100 µm have been used to fabricate diodes. High voltage testing has demonstrated blocking voltages near the theoretical values for 4H-SiC. Blocking voltage of 8 kV has been achieved in devices fabricated on 50 µm thick epitaxial films, blocking voltage of 10 kV has been obtained in devices fabricated on 80 µm thick films and blocking voltage greater than 11.2 kV on 100 µm films. Inspection of failed devices confirmed triangle defects, which form from surface damage or particles present during epitaxy, are killer defects which will cause the device to fail under reverse bias. In addition, the leakage current at the high blocking voltages of the JBS diodes showed no correlation with the screw dislocation density. It is also observed that when the polished wafer is essentially free of scratches, pits and particles, the main source of basal plane dislocations in the epilayer originates within the crystal growth process, corresponding to basal plane defects which were not converted to threading edge defects by the CVD epitaxy process.

A confluence of materials improvements combined with measurement strategy has emerged as a process to develop substrates which enable the fabrication of devices which operate to the expectations of SiC. The process begins by judicious selection of single crystal 4H SiC wafers. The wafers need to be adequately tested with sufficient sampling in order to ascertain the number of defects that originate from the crystal growth process. The inventors have successfully used two techniques to characterize defects in polished crystalline SiC substrates: molten salt etching/visual counting and x-ray topography/visual counting. With either measurement the substrate is interrogated at nine sites on the wafer. It is found that with either approach, characterization of one wafer slice cut from a crystal is sufficient to qualify the performance of the crystal with respect to defects. Once characterized, slices from the crystal can be used in CVD epitaxy processes to grow the crystalline film layers on the polished wafer needed to form the device structure.

It is discovered that a CVD epitaxy process can be optimized for conversion of basal plane defects that cross the plane of the substrate to threading edge dislocations by greater than 99%. By iteration of the CVD parameters of reactant concentration, pressure, temperature and gas flow, the ability of the CVD process to reduce the number of basal plane dislocations crossing the substrate-epitaxy film interfacial plane can be controlled. Thus, the total basal plane dislocations in the epitaxial layers are determined from the polished substrate initial dislocation density and the effectiveness of the epitaxy process to convert basal plane dislocations to threading edge dislocations. Different CVD equipment and environment may require different process optimization. When the optimal method is applied to a wafer selected by the characterization methods described in the above embodiments, the counts of basal plane defects in the epilayer, which cross the plane of the substrate, can be statistically reduced to near or at zero. It is these basal plane defects which must be minimized to achieve adequate power device performance. These basal plane defects are uniquely counted by the molten KOH etching methods previously described. The preferred CVD epitaxy processes used in this invention include a mixture of reactive gases comprised of chlorosilanes, HxSiCl(1−x), a hydrocarbon gas such as propane or ethylene, hydrogen and hydrogen chloride. Regarding CVD growth using chlorosilanes, see, for example, J. Wan, M. J. Loboda, M. F. MacMillan, G. Chung, E. P. Carlson, and V. M. Torres, "Scaling of Chlorosilane SiC CVD to Multiwafer Epitaxy System," Materials Science Forum 556-557, 145 (2007). Regarding the interaction of the epitaxy process on dislocation reduction and surface roughness, see, for example, G. Chung, M. J. Loboda, J. Zhang, J. W. Wan, E. P. Carlson, T. J. Toth, R. E. Stahlbush, M. Skowronski, R. Berechman, Siddarth G. Sundaresan and Ranbir Singh; 4H-SiC Epitaxy With Very Smooth Surface and Low Basal Plane Dislocation on 4 degree Off-axis Wafer, Mat. Sci. Forum Vol 679-680 (2011), p. 123.

Figure 5:
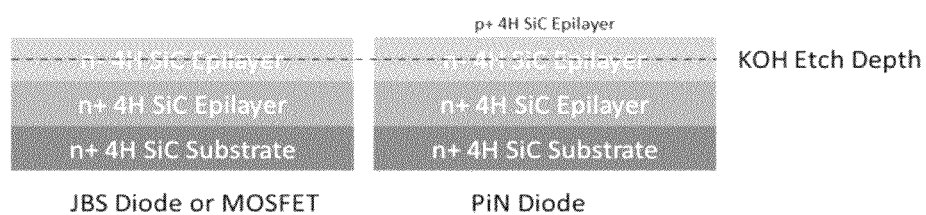
FIG. 5 illustrates an example of a JBS Diode, MOSFET or PiN Diode comprising a substrate and a plurality of epitaxial layers.

FIG. 5 illustrates an example of a JBS Diode, MOSFET or PiN Diode comprising a substrate and a plurality of epitaxial layers. For example, each of a JBS Diode, MOSFET and PiN Diode can comprise an n+4H SiC substrate, an n+4H SiC epitaxial layer or first epilayer over the substrate and an n−4H SiC epitaxial layer or second epilayer over the first epilayer. In the PiN Diode, in addition to the substrate and first and second epilayers, a p+4H SiC epitaxial layer can be formed over the second epilayer. The structure can be etched, for example, down to a point within the second epilayer. The method of etching can be KOH etching.

The evaluation of dislocations in any of the fabricated power devices described above can be performed by KOH etching of the SiC device die. The die can be tested after wafer level probing or after packaging and removal from the package. The area of interest for defect analysis by KOH etching is the active area of the die which confines the current flow. For example, defects are counted below the anode contact in a diode or below the area bounded by the source and drain fingers in a MOSFET. KOH etching will reveal any screw dislocations and also the basal plane dislocations that intersect the plane of the substrate.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A high voltage semiconductor device comprising:
a single crystal, 4° off-axis 4H-SiC substrate tilted away from the c-axis toward the <11-20> direction, having an area of 0.02 to 1.5 cm$^2$ having:
a micropipe density of less than 1/cm$^2$,
a screw dislocation density of less than 2000/cm$^2$, and
a basal plane dislocation density of less than 2000/cm$^2$; and
a plurality of epitaxial layers over the substrate, wherein at least one of the plurality of epitaxial layers has:
a net carrier concentration in the range from $1\times10^{14}$/cm$^3$ to $2\times10^{16}$/cm$^3$,
a micropipe density of less than 1/cm$^2$,
a screw dislocation density of less than 2000/cm$^2$, and
a basal plane dislocation density of less than 10/cm$^2$.

2. The high voltage semiconductor device of claim 1, further comprising at least one p-n junction formed by two adjacent epitaxial layers.

3. The high voltage semiconductor device of claim 1, further comprising at least one epitaxial layer with carrier lifetime of more than 1 microsecond.

4. The high voltage semiconductor device of claim 1, wherein reverse bias blocking voltage, represented as the maximum voltage measured at a leakage current of less than or equal to 10 mA/cm$^2$, is in the range of more than 85% of the theoretical value determined by modeling the device using SiC materials constants.

5. A method for manufacturing a semiconductor device, comprising:
- manufacturing a single crystal, 4° off-axis 4H-SiC substrate tilted away from the c-axis toward the <11-20>direction, having:
  - a micropipe density of less than $1/cm^2$,
  - a screw dislocation density of less than $2000/cm^2$, and
  - a basal plane dislocation density of less than $2000/cm^2$; and
- depositing a plurality of epitaxial layers over the substrate, wherein at least one of the plurality of epitaxial layers has:
  - a net carrier concentration in the range from $1\times10^{14}/cm^3$ to $2\times10^{16}/cm^3$, and
  - a micropipe density of less than $1/cm^2$,
  - a screw dislocation density of less than $2000/cm^2$, and
  - a basal plane dislocation density of less than $10/cm^2$.

6. The method of claim 5, wherein the step of depositing the plurality of epitaxial layers further comprises forming at least one p-n junction.

7. The high voltage semiconductor device of claim 1, wherein the plurality of epitaxial layers is formed by a CVD epitaxy process comprising utilization of a mixture of reactive gases comprising chlorosilanes, $H_xSiCl(1-x)$, a hydrocarbon gas, hydrogen and hydrogen chloride.

8. The high voltage semiconductor device of claim 1, wherein at least one of the plurality of epitaxial layers is formed in a horizontal gas flow CVD epitaxy reactor.

9. The method of claim 5, wherein the plurality of epitaxial layers is formed by a CVD epitaxy process comprising utilization of a mixture of reactive gases comprising chlorosilanes, $H_xSiCl(1-x)$, a hydrocarbon gas, hydrogen and hydrogen chloride.

10. The method of claim 5, wherein at least one of the plurality of epitaxial layers is formed in a horizontal gas flow CVD epitaxy reactor.

* * * * *